United States Patent [19]

Itagaki et al.

[11] Patent Number: 5,070,598
[45] Date of Patent: Dec. 10, 1991

[54] DEVICE FOR MOUNTING ELECTRONIC PARTS

[75] Inventors: Masato Itagaki, Kashiwa; Yosio Haeda, Yaizu; Masamichi Tomita, Ibaraki; Koh Tsuji, Ebina; Housei Higashi, Funabashi, all of Japan

[73] Assignee: Hitachi, Ltd., Tokyo, Japan

[21] Appl. No.: 521,523

[22] Filed: May 10, 1990

[30] Foreign Application Priority Data

May 18, 1989 [JP] Japan .................. 1-125226

[51] Int. Cl.$^5$ .................................. H05K 13/04
[52] U.S. Cl. ...................... 29/705; 29/714; 29/740; 29/759
[58] Field of Search ............ 29/705, 714–719, 29/740, 741, 759, 834–836

[56] References Cited

U.S. PATENT DOCUMENTS 4,794,689  1/1989  Seno et al. .................. 29/705 X

FOREIGN PATENT DOCUMENTS 61-16782   7/1986  Japan .
1-73700    3/1989  Japan .
2186218    8/1987  United Kingdom .

Primary Examiner—Carl E. Hall
Attorney, Agent, or Firm—Antonelli, Terry, Stout & Kraus

[57] ABSTRACT

An electronic parts mounting device roughly turns a mounting head to which an electronic part is sucked in multiple actions in a plurality of steps in accordance with the direction in which the electronic part is to be mounted. Then, the attitude of the electronic part is detected and the mounting head is precisely turned in accordance with the results of the detection so as to correct the attitude of the electronic part so that the electronic part can be accurately mounted on a printed circuit board.

5 Claims, 3 Drawing Sheets

DEVICE FOR MOUNTING ELECTRONIC PARTS

BACKGROUND OF THE INVENTION

The present invention relates to a device and a method for mounting electronic parts on a printed circuit board, and, more particularly to an electronic parts mounting device and a method therefor capable of accurately and quickly providing an angular position for the electronic parts.

There have been electronic parts mounting devices arranged such that an electronic part is sucked to a mounting head in a suction station thereof and is carried to a mounting station thereof at which the electronic part is mounted on a printed circuit board. The position and the attitude of the electronic part thus sucked to the mounting head must be corrected and must have a predetermined angular position (the electronic parts must be turned until they are located in specified mounting angular positions with respect to the printed circuit board) before they are mounted on the printed circuit board.

As disclosed in JP-B-62-12679, a conventional electronic parts mounting device has been arranged in such a manner that the position and the attitude of an electronic part are corrected by rapidly and mechanically holding it by a positioning unit having two pairs of claws at one station. Furthermore, the angular positioning is conducted by turning the positioning unit which is holding the electronic part in a single action by an angular degree of 180° or less. However, the electronic parts mounting device of the type described above encounters a problem in that the electronic part is impacted when it is held by the positioning unit.

As disclosed in JP-A-61-167802, JP-A-61-61499 and JP-A-62-55998, another conventional electronic parts mounting device has been arranged in such a manner that the image of the electronic part sucked to the mounting head is taken by an image pick-up device and the amount of the X and Y directional positional deviations to be corrected and the amount of the angular deviation about a $\theta$-axis (the rotational axis of the mounting head) to be corrected are obtained by a visual recognizing device. Then, the mounting head is turned by 180° or less about the $\theta$-axis in the angular positioning station by a single action in accordance with the thus obtained amount of the angular deviation to be corrected about the $\theta$-axis.

Each of the above-described two conventional structures has the angular positioning mechanism by which the electric part is turned by 180° or less by a single action in one station. Therefore, a Problem arises in that the electronic parts cannot be mounted at high speed. In the latter device, since the mounting nozzle is turned by 180° or less with the electronic part sucked thereto, there is a fear that the position of the electronic Part is changed with respect to the mounting head due to the inertia force of the electronic part over the vacuum suction force if the above described turn is conducted at high speed. Therefore, the angular positioning cannot be conducted at high speed. As a result, an electronic part mounting device has not yet realized a high speed mounting operation.

SUMMARY OF THE INVENTION

Accordingly, an object of the present invention is to provide an electronic parts mounting device capable of accurately providing an angular position for electronic parts at high speed when the parts are positioned by the turn of the mounting head (about an axis thereof).

Another object of the present invention is to provide a mounting method which improves the accuracy of mounting of electronic parts without the reduction in the mounting speed of the electronic parts.

To this end, an electronic parts mounting device according to the present invention is characterized by rough angularly positioning means for roughly turning a mounting heat to which an electronic part is sucked by an angular degree which corresponds to a desired angle by a single or a plurality of operations before the mounting head reaches a visual recognition station, and precise angularly positioning means for precisely turning the mounting head to the desired angular position in accordance with the result of inspection performed by the visual recognition station.

Another aspect of the present invention is characterized by a first turning mechanism for turning a mounting head at high speed with respect to a rotary disc for the purpose of realizing a mounting angular position of the electronic part with respect to the printed circuit board at one stop position between a suction position and a mounting position, means for detecting an attitude of the electronic part sucked to the mounting head after the high speed turn and a second turning mechanism for turning the mounting head at low speed at one stop position downstream of the detecting means in accordance with the results of the detection by the detecting means for the purpose of correcting the angular position of the electronic part.

A further aspect of the present invention lies in an electronic parts mounting device characterized by detection means disposed between a suction station and a mounting station to detect an attitude of the electronic part sucked to a mounting head, a first turning mechanism disposed between the detection means and the suction station to turn the electronic part sucked to the mounting head in accordance with a desired mounting direction, and a second turning mechanism disposed between the detection means and the mounting station to turn the electronic part sucked to the mounting head in accordance with the attitude condition detected by the detection means for the purpose of correcting the angular position of the electronic part.

A still further aspect of the present invention lies in an electronic parts mounting device comprising a mounting head for mounting an electronic part, means for turning the mounting head at high speed in accordance with the direction in which the electronic part sucked to the mounting head is to be mounted on a printed circuit board, means for detecting the attitude of the electronic part sucked to the mounting head, which has been turned at high speed, and means for correcting an angular position of the electronic part by turning the mounting head at low speed in accordance with the attitude of the electronic part detected by the detection means.

A further aspect of the present invention lies in a method of mounting electronic parts comprising the steps of making an electronic part be sucked to a mounting head, turning the mounting head at high speed in accordance with the direction in which the electronic part is mounted on a printed circuit board, detecting an attitude of the electronic part sucked to the mounting head by detection means, and turning the mounting head having the electronic part at low speed in accordance with the attitude thus detected so as to correct an angular position of the electronic part.

That is, according to the present invention, the mounting head is roughly turned by an angle corresponding to a desired mounting angle which is 180° or less by a rough angular positioning means before the mounting head reaches a visual recognition station. Then, an angular position of the electronic part sucked to the mounting head is inspected in the visual recognition station. Subsequently, the mounting head is precisely turned by a precise angular positioning means in accordance with the results of the inspection for the purpose of correcting the deviation from the desired mounting angle, that is accurately meeting the desired mounting angle. Then, the electronic part is mounted from the mounting head onto the printed circuit board on the XY-table.

Since the mounting head is turned at high speed at a head stop position after the electronic part has been sucked to the mounted head, a slip can take place between the mounting head and the electronic part. However, according to another aspect of the present invention, the deviation of the attitude of the electronic part due to the slip can be recognized by the electronic part attitude detection means. Since such deviation is usually small, the deviation can be precisely corrected by turning the mounting head at low speed at another head stop position in accordance with the results of the recognition performed by the above-described detection means.

Other and further objects, features and advantages of the invention will appear more clearly from the following description of the preferred embodiments described with reference to the accompanying drawings.

DESCRIPTION OF PREFERRED EMBODIMENTS

Figure 1:
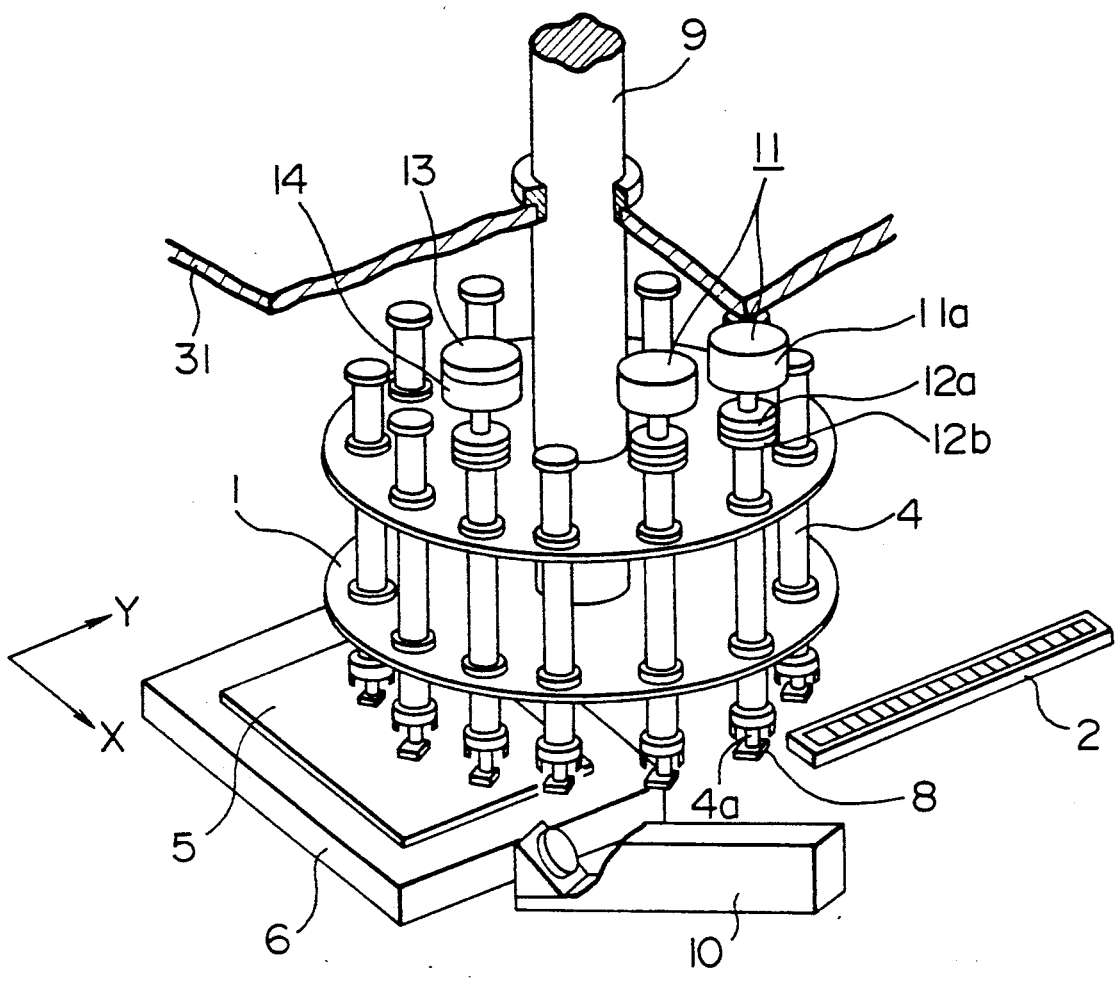
FIG. 1 is a perspective view of an electronic parts mounting device including an angular positioning mechanism according to one embodiment of the present invention.
Figure 2:
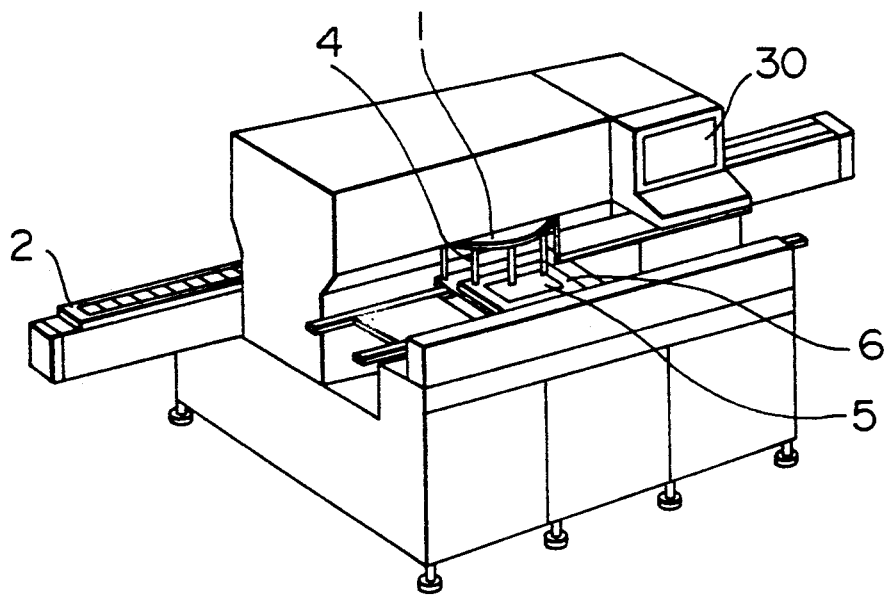
FIG. 2 is an overall perspective view showing the electronic parts mounting device.

Referring to FIGS. 1 and 2, an electronic parts mounting device according to an embodiment of the present invention comprises an index rotary disc 1 having mounting heads 4, an electronic parts supply device 2, an XY table 6 on which a printed circuit board 5 is placed, a visual recognition device 10 and a controller 30. The electronic parts supply device 2 (it is a tape feeder type according to this embodiment) can laterally move and stop in accordance with instructions from the controller 30 so that a desired electronic part 8 is carried to a suction. The index rotary disc 1 intermittently rotates in a predetermined direction. A plurality of mounting heads 4 are provided in a peripheral edge of the disc 1 and spaced equiangularily. They can move upwards and downwards. The mounting head 4 moves downwards to vacuum suck the electronic part 8 from the parts supply device 2 when it reaches the suction station. Then, the mounting head 4 moves upwards with the electronic part 8 and the index rotary disc 1 rotates to transfer the mounting head 4 to the mounting station. When the mounting head 4 reaches the mounting station, it moves downwards to mount the electronic part 8 in a predetermined position on the printed circuit board 5 on the XY-positioning table 6. Then, the mounting head 4 again moves upwards and is again transferred to the suction station due to the rotation of the index rotary disc 1. The above-described operations are repeated. Each of the plurality of mounting heads 4 successively performs the above-described operations.

Figure 3:
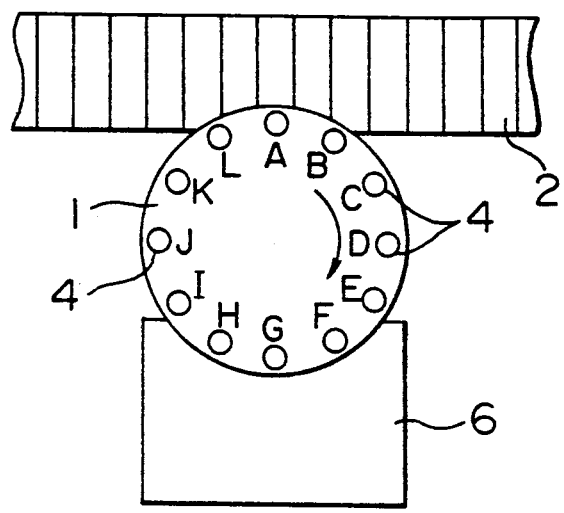
FIG. 3 is a plan view showing a rotary disc shown in FIG. 2.

Referring to FIG. 3, twelve mounting heads 4 are carried by the rotary disc 1 and spaced from one another at the same angular interval as the intermittent rotational angle of the rotary disc 1, and they are rotatable about their respective axes which are parallel to the rotary axis of the rotary disc 1. Each of the mounting heads 4 moves downwards and sucks the electronic part 8 supplied from the parts supply device 2 at a stop position A, which is one of the stop positions. The attitude of the electronic part 8 sucked to the mounting head 4 is image-picked up by the visual recognition device 10 at another stop position C. Then, the mounting head 4 is turned about the axis thereof to angularly position the electronic part 8 and correct the angular positioning thereof at a position E in accordance with the attitude of the electronic part 8 detected by the visual recognition device 10. Then, the electronic part 8 is released from the mounting head 4 at a position G so as to be mounted at a predetermined position on the printed circuit board 5 on the XY-table 6.

The structure of the electronic parts mounting device will now be specifically described with referring to FIG. 1. The parts supply device (the tape feeder) 2 moves laterally and stops at a position specified by the controller 30 shown in FIG. 2. After the parts supply device 2 has been stopped, the electronic part 8 accommodated in the tape feeder 2 is sucked to the mounting head 4 by vacuum effect or the like. Then, the mounting head 4 is intermittently transferred by the intermittent rotation of the index rotary disc 1. The mounting head 4 is turned about the axis thereof by a previously specified angular degree during the above-described intermittent rotation. Then, the visual recognition device 10 detects the X and Y directional positions of the electronic part 8 and the angular deviation to be corrected of the same about the θ-axis (the axis of the mounting head 4). Subsequently the mounting head 4 is further turned by the degree corresponding to the angular deviation to be corrected about the θ-axis. The electronic parts 8 are successively mounted on the printed circuit board 5 on the XY-table 6 which has been mounted in X- and Y-directions in accordance with the correction instructions issued from the controller 30. The correction instructions are according to the X and Y directional positions detected by the device 10.

More specifically, an electronic part 8 accommodated in the parts supply device 2 is sucked by a nozzle 4a disposed at the front end portion of the mounting head 4. The mounting head 4 with the electronic part 8 is turned by an angle of 180° or less (that is, it is turned about its axis) by the respective angular positioning mechanisms 11 at the respective angular positioning stations before it reaches the station at which the device 10 is located. The total turning angle caused by the mechanisms 11 corresponds to the angular degree specified by the controller 30. According to the embodiment shown in FIG. 1, the number of the angular positioning stations is two. The angular positioning mechanism 11 comprises a rotary type motor 11a such as a stepping motor secured to a frame 31 of the device, a magnetic coupling 12a provided on the lower end portion of the rotary type motor 11a, and a magnetic coupling 12b secured to the top end portion of the mounting head 4. The mounting head 4 is turned to provide an angular position with the part 8 by the motor 11a via the magnetic coupling established between the magnetic couplings 12a and 12b when the mounting head 4 reaches the angular positioning station. As a result, the above-described angular positioning is conducted. The motor 11a may be controlled by an open-loop control. Thus, the electronic part 8 sucked to the mounting head 4 which has been angularly positioned by the specified angular degree in the two stations is transferred to the next station at which the position and the attitude of the electronic part 8 is image-picked up by the visual recognition device 10. Thus, the amount of the X and Y directional positional deviation to be corrected and the angular deviation to be corrected about the $\theta$-axis with respect to the centering position and the specified angle are accurately calculated. At the next station, the mounting head 4 is precisely turned by the above-described angular deviation to be corrected about the $\theta$-axis by a precise angular positioning mechanism 14. The mechanism may have a stepping motor, which is closed-loop controlled and provided with an angle detector 13 for the feed-back control. As a result, the angular position of the part 8 is corrected so as to meet the specified one. At the mounting station, the electronic part 8, the angular position of which has been precisely corrected is mounted on a predetermined position of the printed circuit board 5 fixed to the XY-table 6. The XY-table has been moved in X and Y directions by the distances which correspond to the X and Y directional deviation to be corrected.

Figure 4:
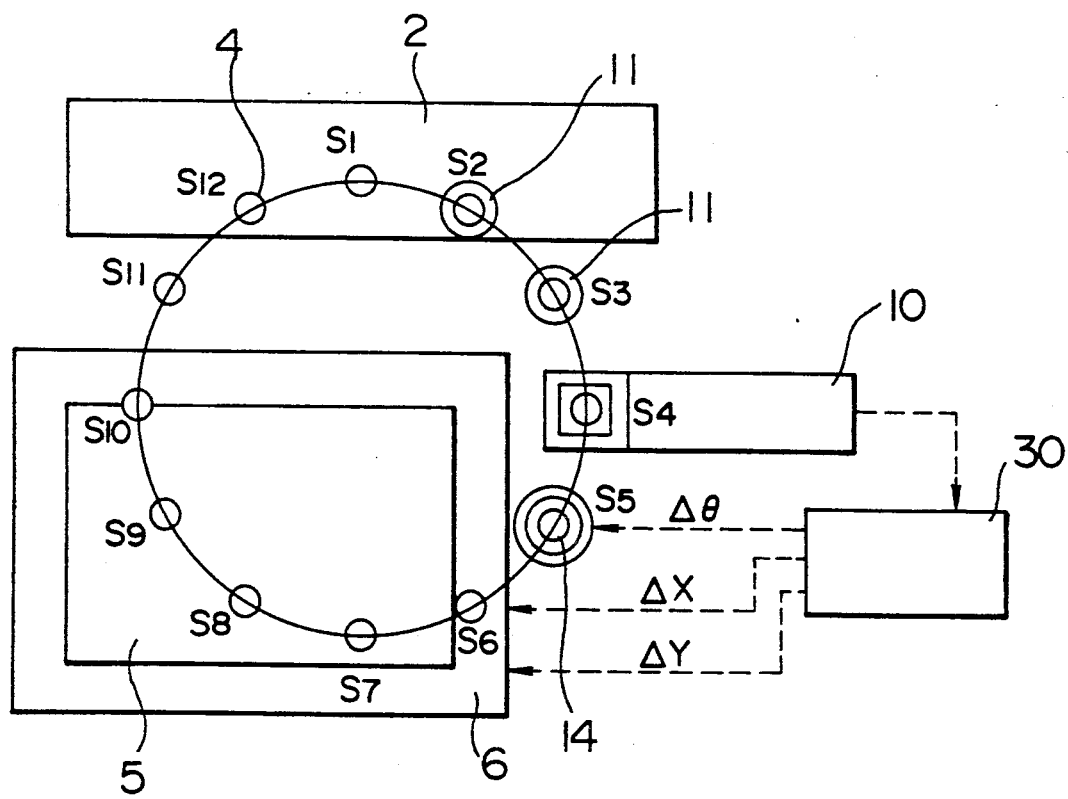
FIG. 4 is a schematic plan view illustrating the operation of the device shown in FIG. 1.

Then, the above-described operation will now be described in detail with reference to FIG. 4.

The mounting head 4 holding the electronic part 8 at station $S_1$ is turned about the axis thereof by a specified angle at a plurality of stations $S_2$ and $S_3$ before it reaches the visual recognition station $S_4$. Then, X and Y directional positional deviations to be corrected, i.e. corrections $\Delta X$ and $\Delta Y$ and the angular deviation to be corrected about the $\theta$-axis, i.e. angular correction $\Delta \theta$ of the electronic part 8 sucked to the mounting head 4 are accurately detected by the visual recognition device 10 at the visual recognition station $S_4$. Thus, the controller 30 issues positioning instructions, calculated by adding the corrections $\Delta X$ and $\Delta Y$ to the desired position value of the XY-table 6, to the driving mechanism for the XY-table 6. The angular correction $\Delta \theta$ is delivered to the precise angular positioning mechanism 14 positioned at station $S_5$. When the above-described mounting head 4 reaches the station $S_5$, it is turned by the angular correction $\Delta \theta$ by the above-described precise angular positioning mechanism 14. As a result, the electronic part 8 sucked to the mounting head 4 is finally precisely and correctly angularly positioned. Then, when the mounting head 4 reaches station $S_7$, the electronic part 8 is, at the desired angular position, mounted on the correct position on the printed circuit board 5 on the XY-table 6 which have been moved by corrections $\Delta X$ and $\Delta Y$.

According to the above-described angular positioning system, a precise angle provision can be conducted by slightly turning the mounting head at the precise angular positioning station in accordance with the angular correction detected in the visual recognition station even if the electronic part is moved with respect to the mounting head during the angular positioning operation conducted before the electronic part reaches the visual recognition station. That is, in the above-described angular positioning system, the mounting head holding the electronic part is roughly turned about to axis to provide an angular position with the electronic part, approximate to the desired angular position thereof, in advance. Subsequently, the visual recognition device detects the actual angular position of the electronic part.

Then the precise angular positioning is conducted by turning the mounting head in accordance with the results of the detection performed by the visual recognition device. In this case, the rough turning of the mounting head may be conducted at high speed. Furthermore, the precise angular positioning can be achieved by turning the mounting head by a reduced angular degree. Therefore, it can be accurately achieved at low speed. As a result, the undesired movement of the electronic part relative to the mounting head at the time of providing the precise angular positioning can be prevented. Therefore, even if the mounting tact of the electronic parts mounting device with respect to the printed circuit board is carried out at a high speed, the electronic parts can be satisfactorily accurately mounted.

According to the first embodiment of the present invention, a motor having a magnetic coupling is employed for each of the angular positioning mechanisms 11 and 14. However, it can be replaced by a proper angular positioning mechanism such as a motor driven gear mechanism which can be detachably engaged with the mounting head which has reached the positioning station. Another structure may be employed in which angular positioning mechanisms for turning the mounting head are provided in the index rotary disc for the respective mounting heads and they are successively operated to turn the mounting head roughly before the electronic part reaches the visual recognition station and to turn it precisely after it has reached the visual recognition station.

Figure 5:
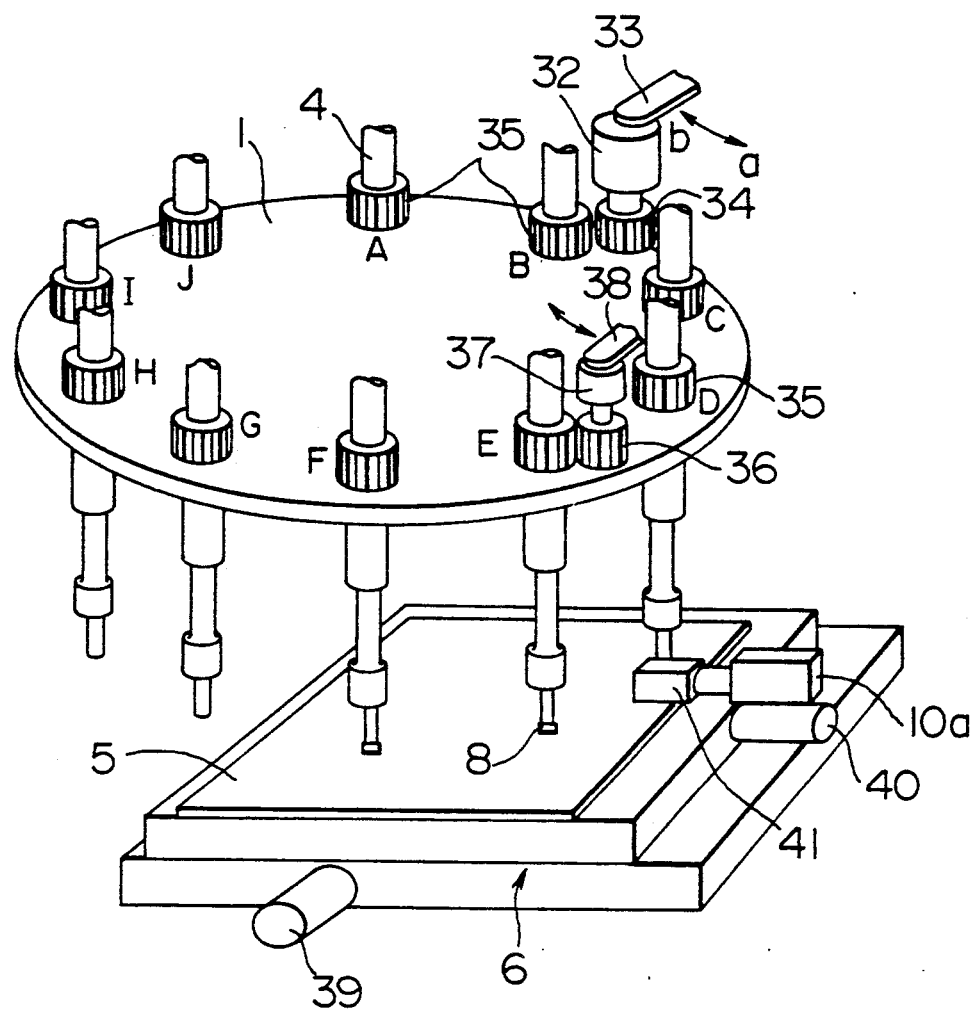
FIG. 5 is a perspective view showing an electronic parts mounting device according to another embodiment of the present invention.

FIG. 5 illustrates another embodiment of the mounting device employing the above-described motor driven gear mechanism. In this embodiment ten mounting heads 4 are provided in the rotary disc 1. The mounting head 4 is able to turn with respect to the disc 1 about an axis parallel to a rotational axis of the rotary disc 1, and is capable of moving upwards/downwards. The rotary disc 1 is intermittently rotated clockwise. Symbols A to J represent the intermittent positions or the mounting head stop positions. The mounting head 4 sucks the electronic part 8 from the electronic parts supply device at a position A (a sucking position), and is moved upwards. The mounting head 4 is then transferred to a position B due to the rotation of the rotary disc 1.

At the position B, an angular positioning motor 32 is disposed to turn the mounting head 4 by an angular degree corresponding to the mounting direction of the electronic part 8 with respect to the printed circuit board 5. The motor 32 is supported by a motor support arm 33 swingably mounted to a stationary member of the device body, and provided an output shaft thereof with a gear 34. On the other hand, a gear 35 is fastened to the respective mounting heads 4. When the rotary disc 1 is to be rotated, the motor support arm 33 is swung in a direction designated by an arrow a so that the gear 34 of the motor 32 is disengaged from the gear 35 fastened to the mounting head 4.

When the mounting head 4 has reached the position B, the motor support arm 33 is swung in a direction designated by an arrow b to make the gear 34 mesh with the gear 35. As a result, the mounting head 4 can be turned by the motor 32. The mounting head 4 at the position B is turned at a high speed in order to turn it by an angular degree (180° or less) which corresponds to the mounting direction of the electronic part 8 with respect to the printed circuit board 5. The motor support arm 33 is swung in the direction designated by the arrow a again after the mounting head 4 has been turned by the desired angular degree. As a result, the gear 34 of the motor 32 is disengaged from the gear 35 of the mounting head 4 to permit the rotary disc 1 to rotate.

Then, at the position D, the attitude of the electronic part 8 sucked to the mounting head 4 is image-picked up by a TV camera 10a (the visual recognition device). The TV camera 10a includes an optical system 41 for introducing the image of the electronic part 8. The image taken by the TV camera 10a is processed to detect the angular deviation to be corrected and the deviation to be corrected of the center position of the electronic part 8. The deviations of electronic part 8 are to be corrected in accordance with the results of the above-described detection. The angular deviation is corrected at the next mounting head stop position E. A motor 37 having a gear 36 for turning the mounting head 4 and a motor support arm 38 are disposed at the position E similarly to those in the position B. In only the case where the angular deviation must be corrected, the gear 36 of the motor 37 is engaged to the gear 35 of the mounting head 4 to turn the mounting head 4 at low speed. As a result, the angular deviation is corrected. Usually, an amount of turn of the mounting head 4 at the position E is extremely small with respect to that at the position B. Therefore, even if the mounting head 4 is turned at low speed at the position E, time loss is not considerable. At the position F (the position at which the electronic part 8 is mounted onto the printed circuit board), the printed circuit board 5 has been placed on the XY-table 6. The XY-table 6 is driven by the motors 39 and 40 for driving the XY-table 6 in accordance with data about the mounted position of the electronic part 8, so that a desired portion of the printed circuit board 5 is brought to the position F. Therefore, the mounting head 4 is moved downwards so that the electronic part 8 is mounted on the printed circuit board 5. The XY-table 6 is so driven as to correct the deviation of the central position of the electronic part 8 detected at the position D.

Figure 6:
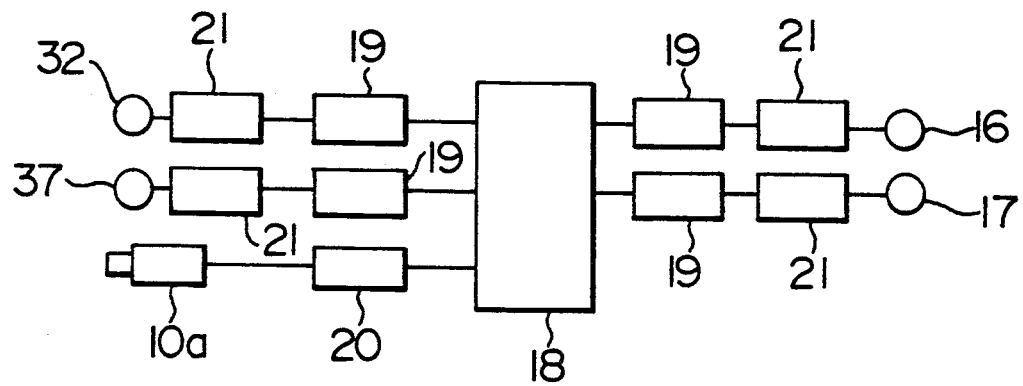
FIG. 6 is a control block diagram for use in the device shown in FIG. 5.

FIG. 6 is a block diagram for controlling the mechanism shown in FIG. 5. Motor controllers 19 receive demands from a main CPU 18 and actuate motor amplifiers 21. As a result, the angular positioning motors 32 and 37 and the XY-table driving motors 39 and 40 shown, shown in FIG. 5 are operated. A camera controller 20 picks up the image of the electronic part 8 through the TV camera 10a in response to the demand from the main CPU 18, and it transmits information about the picked-up image to the main CPU 18. The main CPU 18 calculates the positional deviation and the angular deviation of the electronic part 8 in accordance with the thus received information. In accordance with the thus obtained results, the angular positioning motor 32, the angular position correcting motor 37 and the XY-table driving motors 39 and 40 are controlled so as to correct the above-described deviations.

According to this embodiment, the turning of the mounting head 4 is conducted at different stop positions by using the high-speed angular positioning motor 32 and the low-speed angular position correcting motor 37, respectively. Therefore, the mounting tact of the electronic parts 8 can be maintained and the electronic parts can be accurately mounted on the printed circuit board 5.

According to the present invention, the electronic part sucked to the mounting head is first roughly angularly positioned before it is inspected by the visual recognition device. Thereafter it is inspected by the visual recognition device and then it is precisely angularly positioned to correct the angular deviation inspected. The above-described rough angular positioning may be conducted at high speed. Furthermore, the above-described precise angular positioning after the above-described rough angular positioning has been conducted may be conducted at low speed since the amount of correction is small. Therefore, according to the present invention, the mounting tact of the electronic parts can be maintained and the electronic parts can be accurately mounted on the printed circuit board. As a result, the problem of the unsatisfactory mounting accuracy taking place in a high-speed electronic parts mounting device can be improved.

The above-described rough angular positioning may be performed by a single action at one station before the visual recognition station. Furthermore, the above-described rough angular positioning may be, as the above-described embodiment, achieved by the plurality of positionings at a plurality of stations before the visual recognition station.

What is claimed is:

1. An electronic parts mounting device including stations arranged and functioning such that an electronic part in a parts supply device is, at a suction station thereof, sucked to and held by a mounting head of a plurality of mounting heads provided on a periphery of an index rotary disc for moving the mounting head and electronic part held thereon through said stations, then a position and an angular position of said electronic part held by said mounting head is inspected by an attitude recognition device provided at a visual recognition station, then said electronic part is angularly positioned by turning said mounting head, and then said electronic part is mounted on a printed circuit board on an XY-table thereof, said electronic parts mounting device further comprising:

rough angular positioning means for roughly turning said mounting head with said electronic part by an angular degree which corresponds to the desired angle for said electronic part by multiple actions of less than said angular degree in each of a plurality of said, before said mounting head with said electronic part reaches said visual recognition station; and precise angular positioning means at a further station of said stations for precisely turning said mounting head to an angular degree which corresponds to said desired angle in accordance with the results of the inspection performed by said visual recognition station.

2. An electronic parts mounting device according to claim 1, wherein said rough angular positioning means turns said mounting head under an open loop control in which no angle detector for feedback control is used, while said precise angular positioning means turns said mounting head under a closed loop control in which an angle detector for feedback control is used.

3. An electronic parts mounting device comprising a plurality of mounting heads provided in a periphery of a rotary disc which intermittently rotates, said mounting heads being rotatable with respect to said rotary disc and arranged such that an electronic part is sucked to and held by a mounting head at a stop position of said rotary disc, and said electronic part is released from said mounting head to be mounted on a predetermined position on a printed circuit board at another position of said rotary disc, said electronic parts mounting device further comprising:
  a first turning mechanism for rotating said mounting head at high speed with respect to said rotary disc by multiple actions in a plurality of stop positions of said rotary disc for the purpose of realizing a mounting angle of said electronic part with respect to said printed circuit board, said stop positions being located between said position at which said electronic part is sucked to and held by the mounting head and said another position at which said electronic part is mounted;
  detection means for detecting the attitude of said electronic part sucked to said mounting head after said mounting head and electronic part held thereby are rotated at high speed; and
  a second turning mechanism for rotating said mounting head with respect to said rotary disc at low speed at a following stop position in accordance with the results of said detection performed by said detection means for the purpose of correcting the angular deviation of said electronic part.

4. An electronic parts mounting device including stations arranged and functioning such that an electronic part is sucked to a mounting head at a suction station of said mounting device, is moved with said mounting head through a plurality of stations of said mounting device, and is mounted on a printed circuit board at a mounting station of said mounting device, said electronic parts mounting device further comprising:
  detection means disposed between said suction station and said mounting station to detect an attitude of said electronic part sucked to said mounting head;
  a first mechanism disposed between said detection means and said suction station for turning said electronic part sucked to said mounting head through a total angle in accordance with a desired mounting direction by multiple actions of less than said total angle in each of a plurality of said stations; and
  a second mechanism disposed between said detection means and said mounting station for turning said electronic part sucked to said mounting head in accordance with the attitude detected by said detection means for the purpose of correcting the angular deviation of said electronic part.

5. An electronic parts mounting device comprising:
  a mounting head to which an electronic part is sucked for mounting the electronic part onto a printed circuit board;
  means for moving said mounting head and an electronic part carried thereby through stations of said device;
  means for turning said mounting head through a total angle at high speed by multiple actions of less than said total angle in each of a plurality of said stations in accordance with the direction in which an electronic part sucked to said mounting head is to be mounted on said printed circuit board;
  means for detecting the attitude of said electronic part sucked to said mounting head which has been turned at high speed; through said total angle speed; and
  means for correcting the angular deviation of said electronic part by turning said mounting head at low speed at a further station of said stations in accordance with the attitude of said electronic part detected by said detecting means.

* * * * *